United States Patent
Hsieh et al.

(10) Patent No.: US 6,867,426 B2
(45) Date of Patent: Mar. 15, 2005

(54) LIGHT EMITTING DIODE HAVING A TRANSPARENT SUBSTRATE

(75) Inventors: Min-Hsun Hsieh, Hsin-Chu (TW);
Keun-Ru Chuang, Hsin-Chu (TW);
Shane-Shyan Wey, Hsin-Chu (TW);
Chih-Chiang Lu, Hsin-Chu (TW);
Ming-Jiunn Jou, Hsin-Chu (TW);
Shu-Wen Sung, Hsin-Chu (TW);
Chia-Cheng Liu, Hsin-Chu (TW);
Chao-Nien Huang, Hsin-Chu (TW)

(73) Assignee: Epistar Corporation, Hsin-Chu (TW)

( * ) Notice: Subject to any disclaimer, the term of this patent is extended or adjusted under 35 U.S.C. 154(b) by 0 days.

(21) Appl. No.: 09/683,959

(22) Filed: Mar. 6, 2002

(65) Prior Publication Data

US 2003/0003613 A1 Jan. 2, 2003

(30) Foreign Application Priority Data

Jun. 27, 2001 (TW) ........................ 90115871 A

(51) Int. Cl.⁷ ................ H01L 29/06; H01L 31/072; H01L 31/109; H01L 31/0328; H01L 31/0336

(52) U.S. Cl. ........................................ 257/12; 257/965
(58) Field of Search .................. 257/12, 13, 14, 257/16, 21, 37, 965

(56) References Cited

U.S. PATENT DOCUMENTS 4,728,370 A * 3/1988 Ishii et al. .................. 136/258

* cited by examiner

*Primary Examiner*—Phuc T. Dang
(74) *Attorney, Agent, or Firm*—Winston Hsu

(57) ABSTRACT

A light emitting diode having a transparent substrate and a method for manufacturing the same. The light emitting diode is formed by creating two semiconductor multilayers and bonding them. The first semiconductor multilayer is formed on a non-transparent substrate. The second semiconductor multilayer is created by forming an amorphous interface layer on a transparent substrate. The two semiconductor multilayers are bonded and the non-transparent substrate is removed, leaving a semiconductor multilayer with a transparent substrate.

8 Claims, 8 Drawing Sheets

LIGHT EMITTING DIODE HAVING A TRANSPARENT SUBSTRATE

BACKGROUND OF INVENTION

1. Field of the Invention

The present invention relates to a light emitting diode, more specifically to a light emitting diode having a transparent substrate, and a method for manufacturing the same.

2. Description of the Related Art

Light emitting diodes (LEDs) are employed in a wide variety of applications including optical display devices, traffic lights, data storage equipment, communication devices, illumination apparatuses, and medical treatment equipment. Some of the main goals of engineers who design LEDs are to increase the brightness of the light emitted from LEDs and to reduce the cost of manufacturing LEDs.

U.S. Pat. No. 5,783,477 discloses a method of bonding two compound semiconductor surfaces to produce an ohmic contact interface. The method of manufacturing a prior art LED is to create an ohmic contact interface by aligning the crystallographic orientation and rotational alignment of two semiconductor surfaces and applying uniaxial pressure to the semiconductor wafers at a temperature of 1000° C. In actual procedure, however, it is difficult and expensive to align the crystallographic orientation and rotational alignment of the two semiconductor surfaces.

SUMMARY OF INVENTION

It is an objective of the claimed invention to provide a light emitting diode (LED) having a transparent substrate and the method for manufacturing the same. The method involves wafer bonding a transparent substrate with a compound semiconductor multilayer. The compound semiconductor multilayer comprising the LED is grown on a non-transparent substrate. The transparent substrate and the compound semiconductor multilayer are bonded using an amorphous interface layer. After the bonding, the non-transparent substrate is removed, leaving an LED with a transparent substrate. The method according to the claimed invention will simplify the procedure of manufacturing LEDs, thereby reducing costs. The method also solves the problem of aligning the crystallographic orientation and rotational alignment of the two semiconductor surfaces and creates a light emitting diode with an increased luminance.

In the claimed invention, a light emitting diode comprises a sapphire transparent substrate. Formed above the substrate is an indium tin oxide (ITO), a top surface of which comprises a first surface region and a second surface region. On the first surface region, the layers of the semiconductor multilayer stacked from bottom to top are: A p$^+$-type contact layer of GaAs, a p-type cladding layer of AlGaInP, a multiple quantum well (MQW) light-emitting layer, an n-type cladding layer of AlGaInP, an n-type stop layer of AlGaAs, and an ITO transparent conductive layer. A first electrode is located on the ITO transparent conductive layer, and a second electrode is located on the second surface region.

The claimed invention also details a method for manufacturing the light emitting diode. The first step is to form a first multilayer on an n-type GaAs semiconductor substrate. An n-type stop layer of AlGaAs is formed on the semiconductor substrate. An n-type cladding layer of AlGaInP is formed on the n-type stop layer. An MQW light-emitting layer of AlGaInP is formed on the n-type cladding layer. A p-type cladding layer of AlGaInP is formed on the MQW light-emitting layer. A p$^+$-type contact layer of GaAs is formed on the p-type cladding layer. A second multilayer is formed on a sapphire substrate. An amorphous interface layer of ITO IS formed on the sapphire substrate. A third multilayer is produced by placing the first multilayer on the second multilayer and bonding the first multilayer to the second multilayer by elevating temperature. Next, the n-type GaAs semiconductor substrate of the newly created third multilayer is removed, and an ITO transparent conductive layer is formed on the stop layer to produce a fourth multilayer. Next, an exposed interface region is formed by etching away a portion of the fourth multilayer from the ITO transparent conductive layer to the ITO amorphous interface layer. Finally, a first contact electrode and a second contact electrode are formed on the ITO transparent conductive layer and the exposed interface region, respectively.

These and other objectives of the claimed invention will no doubt become obvious to those of ordinary skill in the art after having read the following detailed description of the preferred embodiment that is illustrated in the various figures and drawings.

DETAILED DESCRIPTION

Figure 1:
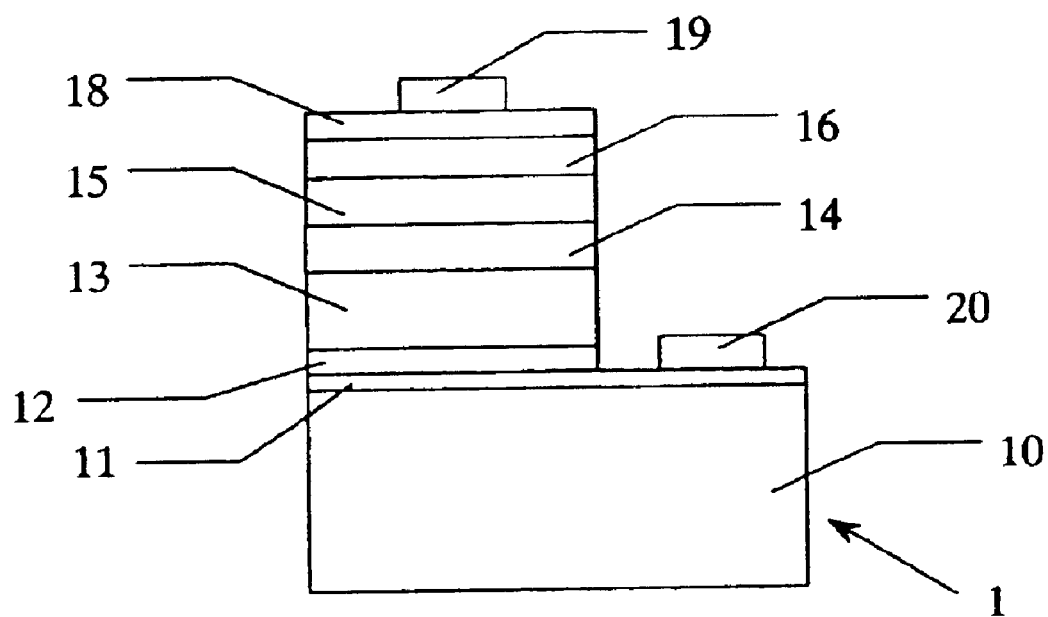
FIG. 1 is a cross sectional view of a high brightness light emitting diode having a transparent substrate according to the first embodiment of the present invention.

FIG. 1 is a cross sectional view of a high brightness light emitting diode (LED) 1 having a transparent substrate according to the first embodiment of the present invention. In the LED 1, an indium tin oxide (ITO) amorphous interface layer 11 is formed on a sapphire transparent substrate 10. A top surface of the ITO amorphous interface layer 11 comprises a first surface region and a second surface region. The LED further comprises layers stacked upon each other on the first surface region in the following order, bottom to top: a contact layer of p$^+$-type GaAs 12, a cladding layer of a p-type AlGaInP 13, a multiple quantum well (MQW) light-emitting layer 14, a cladding layer of n-type AlGaInP 15, a stop layer of n-type AlGaAs 16, and an ITO transparent conductive layer 18. A first electrode 19 is located on the ITO transparent conductive layer 18, and a second electrode 20 is located on the second surface region.

Figure 2:
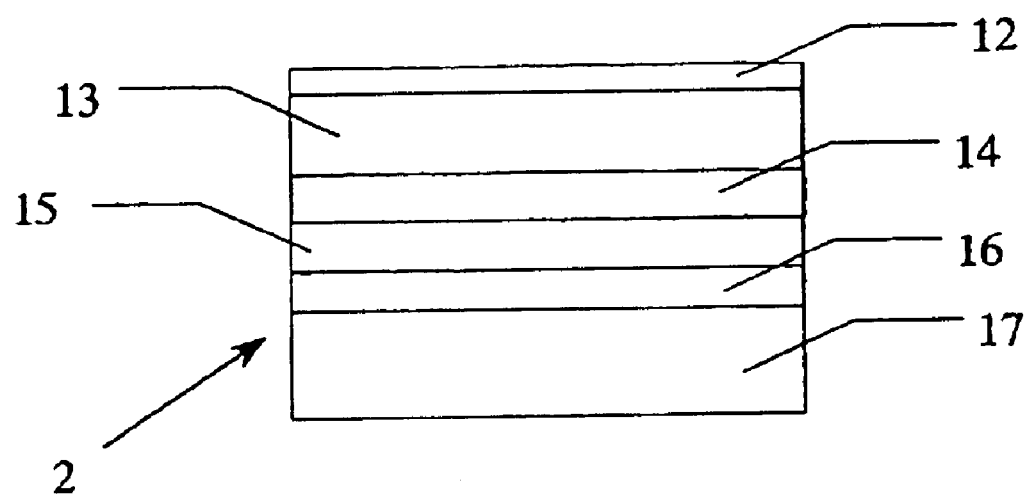
FIG. 2 is a cross sectional view showing a first semiconductor multilayer before wafer bonding during the manufacturing method according to the present invention.
Figure 3:
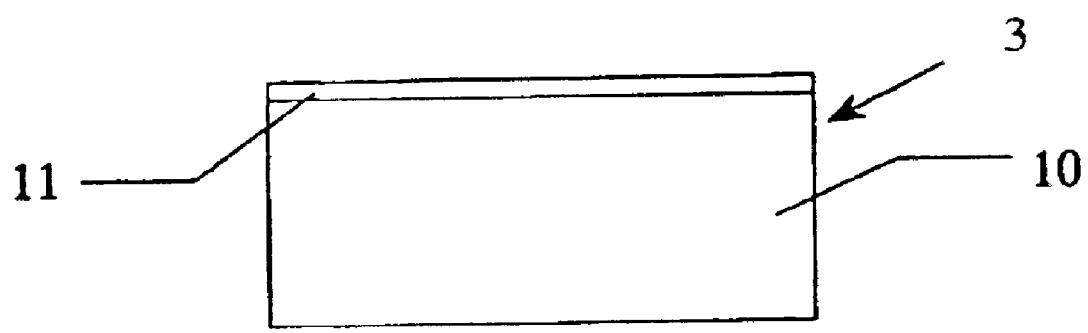
FIG. 3 is a cross sectional view showing an amorphous interface layer and a second semiconductor multilayer before wafer bonding during the manufacturing method according the present invention.
Figure 4:
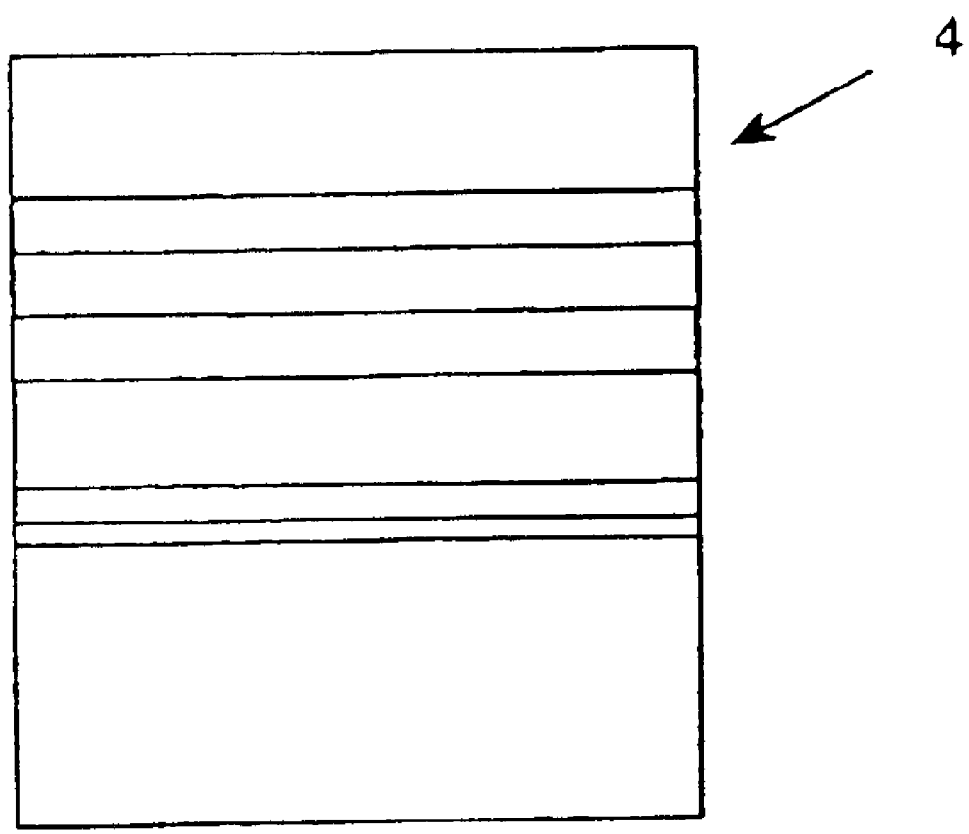
FIG. 4 is a cross sectional view showing a third semiconductor multilayer after wafer bonding, but before removal of the non-transparent substrate during the manufacturing method according the present invention.
Figure 5:
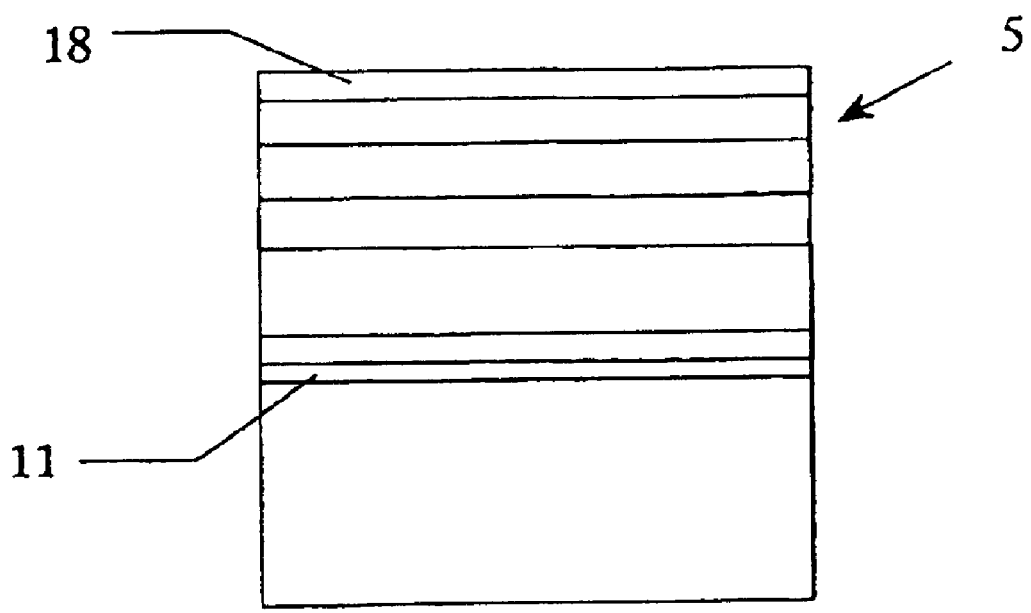
FIG. 5 is a cross sectional view showing a third semiconductor multilayer after removal of the non-transparent substrate and formation of an ITO transparent conductive layer during the manufacturing method according the present invention.

FIG. 2 and FIG. 3 illustrate a method for manufacturing the light emitting diode 1 according to the first embodiment of the present invention. A first semiconductor multilayer 2 is created by first forming an n-type stop layer 16 of AlGaAs on an n-type GaAs semiconductor substrate 17. Then an n-type cladding layer 15 of AlGaInP is formed on the n-type stop layer 16. An MQW light-emitting layer 14 of AlGaInP is formed on the n-type cladding layer 15. A p-type cladding layer 13 of AlGaInP is formed on the MQW light-emitting layer 14, and a p$^+$-type contact layer 12 of GaAs is formed on the p-type cladding layer 13. Next, a second semiconductor multilayer 3 is created. The second semiconductor multilayer 3 comprises an amorphous interface layer 11 of ITO formed on a sapphire substrate 10. As is shown in FIG. 4, a third semiconductor multilayer 4 is produced by inverting the first semiconductor multilayer 2, placing it on the semiconductor multilayer 3, and bonding the first semiconductor multilayer 2 to the second semiconductor multilayer 3 by elevating temperature and applying uniaxial pressure to the semiconductor multilayers. FIG. 4 and FIG. 5 show the next step, which comprises the removal of the n-type GaAs semiconductor substrate 17 from the multilayer 4 and the formation of a first ITO transparent conductive layer 18 on the n-type stop layer 16, producing a fourth semiconductor multilayer 5. Next, an interface exposed region is formed by etching away a portion of the fourth semiconductor multilayer 5 from the first ITO transparent conductive layer 18 to the ITO amorphous interface layer 11. Finally, a first contact electrode 19 and a second contact electrode 20 are formed on the first ITO transparent conductive layer 18 and the interface exposed region, respectively.

Figure 6:
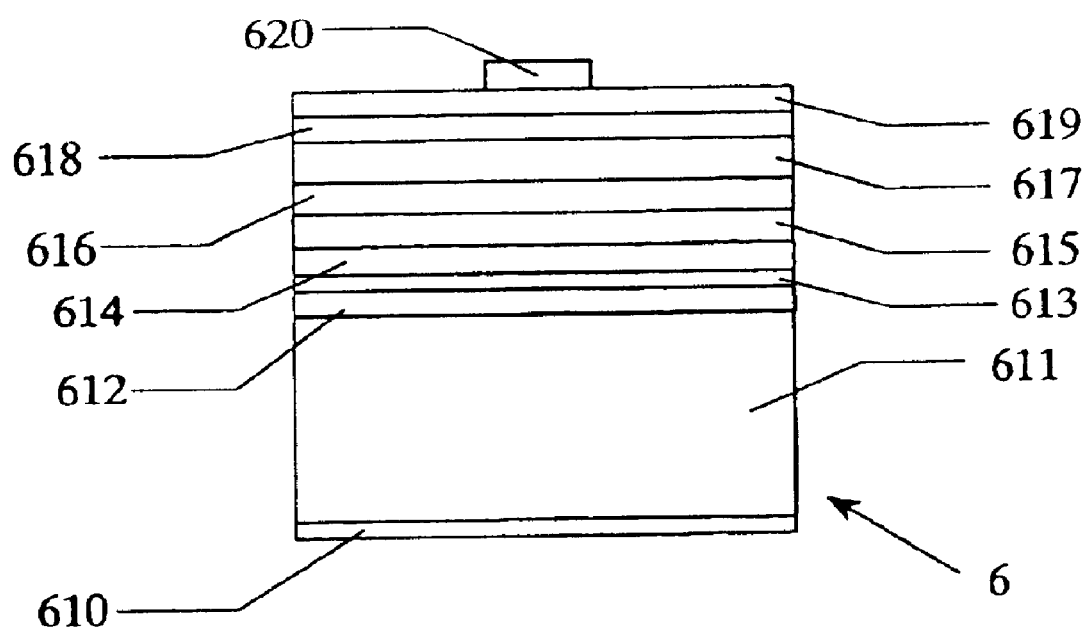
FIG. 6 is a cross sectional view of a high brightness light emitting diode having a transparent substrate according to the second embodiment of the invention.

FIG. 6 illustrates a light emitting diode 6 having a transparent substrate according to a second preferred embodiment of the present invention. A transparent substrate 611 of p-type GaP is formed on an ohmic contact electrode 610. A first p$^+$-type contact layer 612 of GaAs is formed on the transparent substrate 611. An indium tin oxide (ITO) amorphous interface layer 613 is formed on the first p$^+$-type contact layer 612. A second p$^+$-type contact layer 614 of GaAs is formed on the ITO amorphous interface layer 613. A p-type cladding layer 615 of AlGaInP is formed on the second p$^+$-type contact layer 614. A multiple quantum well (MQW) light-emitting layer 616 of AlGaInP is formed on the p-type cladding layer 615. An n-type cladding layer 617 of AlGaInP is formed on the MQW light-emitting layer 616. An n-type stop layer 618 of AlGaAs is formed on the n-type cladding layer 617. An ITO transparent conductive layer 619 is formed on the n-type stop layer 618. An electrode 620 is formed on the ITO transparent conductive layer 619.

Figure 7:
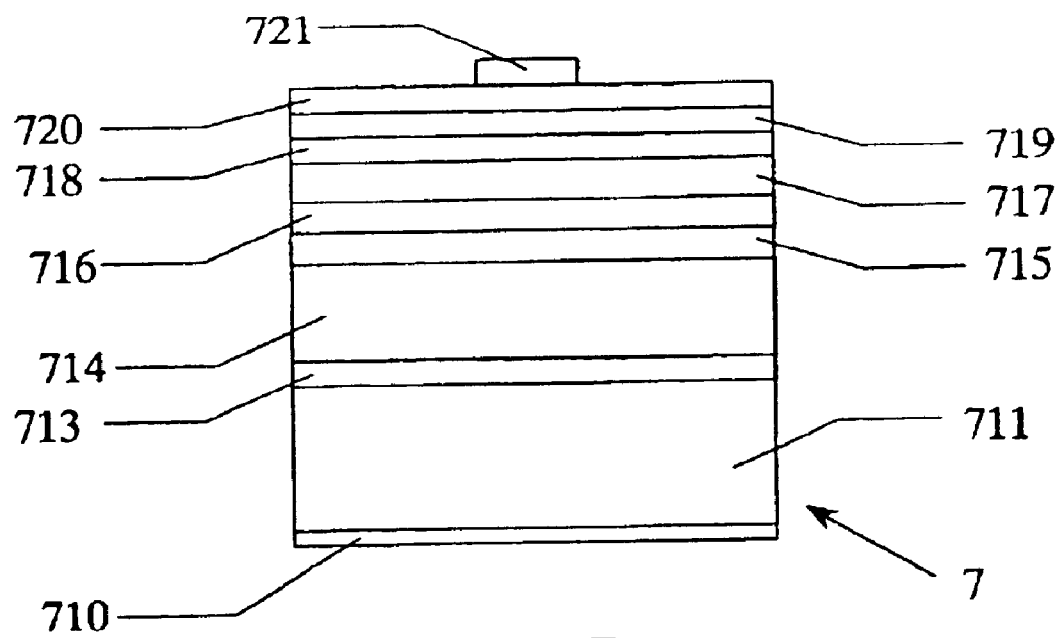
FIG. 7 is a cross sectional view of a high brightness light emitting diode having a transparent substrate according to the third embodiment of the invention.

FIG. 7 illustrates a light emitting diode 7 having a transparent substrate according to a third preferred embodiment of the present invention. A transparent substrate 711 of n-type GaP is formed on a first electrode 710. An indium tin oxide (ITO) amorphous interface layer 713 is formed on the transparent substrate 711. An n-type contact layer 714 of GaP is formed on the ITO amorphous interface layer 713. An n-type cladding layer 715 of AlGaInP is formed on the n-type contact layer 714. A multiple quantum well (MQW) light-emitting layer 716 of AlGaInP is formed on the n-type cladding layer 715. A p-type cladding layer 717 of AlGaInP is formed on the MQW light-emitting layer 716. A p-type buffer layer 718 of AlGaAs is formed on the p-type cladding layer 717. A p$^+$-type contact layer 719 of GaAs is formed on the p-type buffer layer. An ITO transparent conductive layer 720 is formed on the p$^+$-type contact layer 719. A second electrode 721 is formed on the ITO transparent conductive layer 720.

Figure 8:
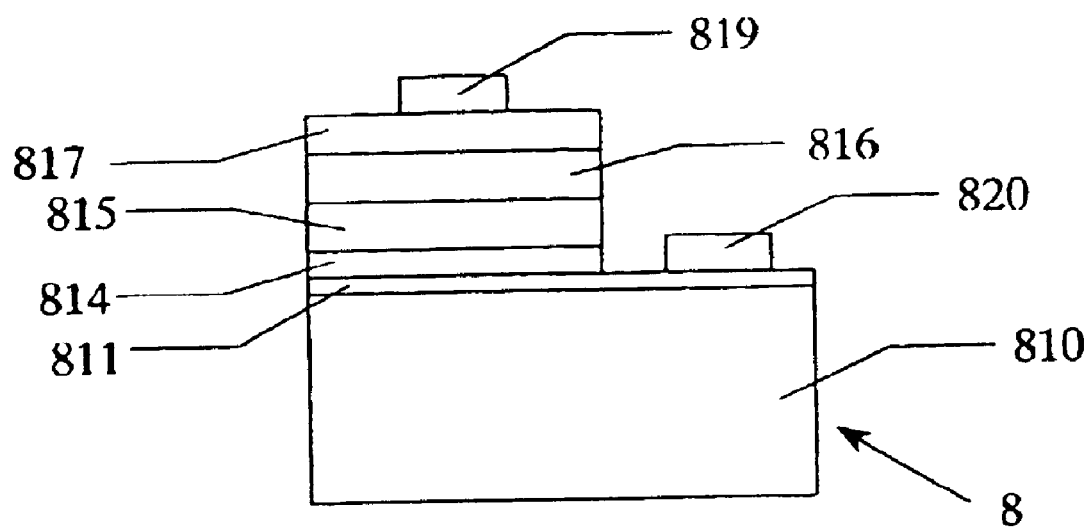
FIG. 8 is a cross sectional view of a high brightness light emitting diode having a transparent substrate according to the fourth embodiment of the invention.

FIG. 8 illustrates a light emitting diode 8 having a transparent substrate according to a fourth preferred embodiment of the present invention. An indium tin oxide (ITO) amorphous interface layer 811 is formed on a transparent substrate 810 of glass. A top surface of the ITO amorphous interface layer 811 comprises a first surface region and a second surface region. An n$^+$-type reverse tunneling contact layer 814 of InGaN is formed on the first surface region. A p-type cladding layer 815 of GaN is formed on the n$^+$-type reverse tunneling contact layer 814. A multiple quantum well (MQW) light-emitting layer 816 of InGaN is formed on the p-type cladding layer 815. An n-type cladding layer 817 of GaN is formed on the MQW light-emitting layer 816. A first Ti—Al contact electrode is formed on the n-type cladding layer 817. A second electrode 820 is formed on the second surface region.

According to the description of these embodiments, LEDs having a transparent substrate can be manufactured by a method of bonding two chips using an amorphous interface layer. LEDs made according to the present invention are easier to manufacture, less expensive to manufacture, and brighter than those made according to the prior art.

While the invention has been disclosed and described with reference to these preferred embodiments, the scope of the invention is not limited to these preferred embodiments. Any variation and modifications of the invention still falls within the spirit and scope of the invention. For example, using a transparent conductive layer of adhesive agent instead of a single-crystal interface layer or using a single quantum well light-emitting layer instead of a multiple quantum well light-emitting layer cannot escape the scope and spirit of the invention. Moreover, the manufacturing method of the present invention is also suitable for manufacturing a light emitting diode having a non-transparent substrate.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A light emitting diode having a transparent substrate, the light emitting diode comprising:
    a transparent substrate;
    an amorphous interface layer formed on the transparent substrate;
    a top surface of the amorphous interface layer comprising a first surface region and a second surface region;
    a p$^+$-type contact layer formed on the first surface region;
    a p-type cladding layer formed on the p$^+$-type contact layer;
    a multiple quantum well (MQW) light-emitting layer formed on the p-type cladding layer;
    an n-type cladding layer formed on the MQW light-emitting layer;
    an n-type stop layer formed on the n-type cladding layer;
    a transparent conductive layer formed on the n-type stop layer;
    a first electrode formed on the transparent conductive layer; and
    a second electrode formed on the second surface region.

2. A light emitting diode having a transparent substrate, the light emitting diode comprising:
    a transparent substrate comprising sapphire;
    an amorphous interface layer formed on the transparent substrate, a top surface of the amorphous interface layer comprising a first surface region and a second surface region;
    a contact layer of p$^+$-type GaAs formed on the first surface region;
    a p-type cladding layer of p-type AlGaInP formed on the contact layer;

a light-emitting layer of AlGaInP formed on the p-type cladding layer;

an n-type cladding layer of n-type AlGaInP formed on the light-emitting layer;

a stop layer of n-type AlGaAs formed on the n-type cladding layer;

an indium tin oxide (ITO) transparent conductive layer formed on the stop layer;

a first electrode formed on the ITO transparent conductive layer; and a second electrode formed on the second surface region.

3. A light emitting diode having a transparent substrate, the light emitting diode comprising:

an ohmic contact electrode;

a p-type transparent substrate formed on the ohmic contact electrode;

a first $p^+$-type contact layer formed on the transparent substrate;

an amorphous interface layer formed on the first $p^+$-type contact layer;

a second $p^+$-type contact layer formed on the amorphous interface layer;

a p-type cladding layer formed on the second $p^+$-type contact layer;

a light-emitting layer formed on the p-type cladding layer;

an n-type cladding layer formed on the light-emitting layer;

an n-type stop layer formed on the n-type cladding layer;

a transparent conductive layer formed on the n-type stop layer; and a first electrode formed on the transparent conductive layer.

4. A light emitting diode having a transparent substrate, the light emitting diode comprising:

an ohmic contact electrode;

a p-type GaP transparent substrate formed on the ohmic contact electrode;

a first $p^+$-type contact layer of $p^+$-type GaAs formed on the p-type GaP transparent substrate;

an indium tin oxide amorphous interface layer formed on the first $p^+$-type contact layer;

a second $p^+$-type contact layer of $p^+$-type GaAs formed on the indium tin oxide amorphous interface layer;

a p-type cladding layer of a p-type AlGaInP formed on the second $p^+$-type contact layer;

a multiple quantum well light-emitting layer of AlGaInP formed on the p-type cladding layer;

an n-type cladding layer of n-type AlGaInP formed on the light-emitting layer;

a stop layer of n-type AlGaAs formed on the n-type cladding layer;

an indium tin oxide (ITO) transparent conductive layer formed on the stop layer;

a first electrode formed on the ITO transparent conductive layer.

5. A light emitting diode having a transparent substrate, the light emitting diode comprising:

a first electrode;

an n-type transparent substrate formed on the first electrode;

an amorphous interface layer formed on the n-type transparent substrate;

an n-type contact layer formed on the amorphous interface layer;

an n-type cladding layer formed on the n-type contact layer;

a light-emitting layer formed on the n-type cladding layer;

a p-type cladding layer formed on the light-emitting layer;

a p-type buffer layer formed on the p-type cladding layer;

a $p^+$-type contact layer formed on the p-type buffer layer;

a transparent conductive layer formed on the $p^+$-type contact layer; and a second electrode formed on the transparent conductive layer.

6. A light emitting diode having a transparent substrate, the light emitting diode comprising:

a first electrode;

a transparent substrate of n-type GaP formed on the first electrode;

an indium tin oxide (ITO) amorphous interface layer formed on the transparent substrate of n-type GaP;

a contact layer of n-type GaP formed on the ITO amorphous interface layer;

a cladding layer of n-type AlGaInP formed on the contact layer of n-type GaP;

a multiple quantum well (MQW) light-emitting layer of AlGaInP formed on the cladding layer of n-type AlGaInP;

a cladding layer of p-type AlGaInP formed on the MQW light-emitting layer of AlGaInP;

a buffer layer of p-type AlGaAs formed on the cladding layer of p-type AlGaInP;

a contact layer of $p^+$-type GaAs formed on the buffer layer of p-type AlGaAs;

an indium tin oxide (ITO) transparent conductive layer formed on the contact layer of $p^+$-type GaAs; and a second electrode formed on the ITO transparent conductive layer.

7. A light emitting diode having a transparent substrate, the light emitting diode comprising:

a transparent substrate;

an amorphous, interface layer formed on the transparent substrate, a top surface of the amorphous interface layer comprising a first surface region and a second surface region;

an $n^+$-type reverse-tunneling contact layer formed on the first surface region;

a p-type cladding layer of formed on the $n^+$-type reverse-tunneling contact layer;

a light-emitting layer formed on the p-type cladding layer;

an n-type cladding layer formed on the light-emitting layer;

a first contact electrode formed on the n-type cladding layer; and a second electrode formed on the second surface region.

8. A light emitting diode having a transparent substrate, the light emitting diode comprising:

a transparent substrate comprising glass;

an indium tin oxide (ITO) amorphous interface layer formed on the transparent substrate, a top surface of the ITO amorphous interface layer comprising a first surface region and a second surface region;

a reverse-tunneling contact layer of n$^+$-type InGaN formed on the first surface region;

a cladding layer of a p-type GaN formed on the reverse-tunneling contact layer of n$^+$-type InGaN;

a multiple quantum well (MQW) light-emitting layer of InGaN formed on the cladding layer of a p-type GaN;

a cladding layer of n-type GaN formed on the MQW light-emitting layer of InGaN;

a first contact electrode formed on the cladding layer of n-type GaN;

a second electrode formed on the second surface region.

* * * * *